US009110377B2

(12) United States Patent
Loopstra et al.

(10) Patent No.: US 9,110,377 B2
(45) Date of Patent: Aug. 18, 2015

(54) LITHOGRAPHIC APPARATUS, EUV RADIATION GENERATION APPARATUS AND DEVICE MANUFACTURING METHOD

(75) Inventors: Erik Roelof Loopstra, Eindhoven (NL); Gerardus Hubertus Petrus Maria Swinkels, Eindhoven (NL); Erik Petrus Buurman, Veldhoven (NL); Uwe Bruno Heini Stamm, Goettingen (DE)

(73) Assignee: ASML NETHERLANDS B.V., Veldhoven (NL)

( * ) Notice: Subject to any disclaimer, the term of this patent is extended or adjusted under 35 U.S.C. 154(b) by 217 days.

(21) Appl. No.: 13/817,792

(22) PCT Filed: Aug. 4, 2011

(86) PCT No.: PCT/EP2011/063443
§ 371 (c)(1),
(2), (4) Date: Feb. 19, 2013

(87) PCT Pub. No.: WO2012/031841
PCT Pub. Date: Mar. 15, 2012

(65) Prior Publication Data

US 2013/0141709 A1 Jun. 6, 2013

Related U.S. Application Data

(60) Provisional application No. 61/380,959, filed on Sep. 8, 2010.

(51) Int. Cl.
*H05G 2/00* (2006.01)
*G03F 7/20* (2006.01)
(Continued)

(52) U.S. Cl.
CPC ........ *G03F 7/70033* (2013.01); *B23K 26/0643* (2013.01); *G03F 7/70025* (2013.01);
(Continued)

(58) Field of Classification Search
CPC ............ G03F 7/70025; G03F 7/70033; G03F 7/70191; G03F 7/7055; H01S 3/0071; H01S 3/0064; H05G 2/001; H05G 2/008
USPC ....... 250/493.1, 504 R, 492.2, 494.1; 378/34, 378/119, 143; 355/67
See application file for complete search history.

(56) References Cited

U.S. PATENT DOCUMENTS 4,194,813 A 3/1980 Benjamin et al.
4,257,017 A 3/1981 Bradley et al.
(Continued)

OTHER PUBLICATIONS

International Search Report mailed Dec. 29, 2011 in corresponding International Patent Application No. PCT/EP2011/063443.
(Continued)

*Primary Examiner* — Steven H Whitesell Gordon
(74) *Attorney, Agent, or Firm* — Pillsbury Winthrop Shaw Pittman LLP

(57) ABSTRACT

An EUV radiation generation apparatus includes a laser configured to generate pulses of laser radiation, and an optical isolation apparatus that includes a rotatably mounted reflector and a radially positioned reflector. The rotatably mounted reflector and the laser are synchronized such that a reflective surface of the rotatably mounted reflector is in optical communication with the radially positioned reflector when the optical isolation apparatus receives a pulse of laser radiation to allow the pulse of laser radiation to pass to a plasma formation location and cause a radiation emitting plasma to be generated via vaporization of a droplet of fuel material. The rotatably mounted reflector and the laser are further synchronized such that the reflective surface of the rotatably mounted reflector is at least partially optically isolated from the radially positioned reflector when the optical isolation apparatus receives radiation reflected from the plasma formation location.

15 Claims, 5 Drawing Sheets

(51) Int. Cl.

| | |
|---|---|
| ***B23K 26/06*** | (2014.01) |
| *H01S 3/00* | (2006.01) |
| *H01S 3/23* | (2006.01) |

(52) U.S. Cl.

CPC .......... *G03F7/7055* (2013.01); *G03F 7/70191* (2013.01); *H05G 2/001* (2013.01); *H05G 2/008* (2013.01); *H01S 3/0071* (2013.01); *H01S 3/2308* (2013.01)

(56) References Cited

U.S. PATENT DOCUMENTS

| | | | | |
|---|---|---|---|---|
| 6,339,634 | B1 | 1/2002 | Kandaka et al. | |
| 2005/0199829 | A1* | 9/2005 | Partlo et al. ............... | 250/504 R |
| 2005/0205811 | A1* | 9/2005 | Partlo et al. ............... | 250/504 R |
| 2006/0011870 | A1* | 1/2006 | Yamamoto et al. ........ | 250/504 R |
| 2008/0087847 | A1 | 4/2008 | Bykanov et al. | |
| 2008/0149862 | A1* | 6/2008 | Hansson et al. .......... | 250/504 R |
| 2009/0161201 | A1 | 6/2009 | Ershov et al. | |
| 2010/0117009 | A1 | 5/2010 | Moriya et al. | |
| 2010/0127191 | A1* | 5/2010 | Partlo et al. ............... | 250/504 R |
| 2010/0182579 | A1 | 7/2010 | Loopstra et al. | |
| 2011/0140008 | A1* | 6/2011 | Bergstedt et al. .......... | 250/504 R |

OTHER PUBLICATIONS

Norbert R. Böwering et al., "Performance results of laser-produced plasma test and prototype light sources for EUV lithography," J. Micro. Nanolith., Mems and Moems, vol. 8, No. 4, pp. 041504-1-041504-11 (Oct.-Dec. 2009).

* cited by examiner

LITHOGRAPHIC APPARATUS, EUV RADIATION GENERATION APPARATUS AND DEVICE MANUFACTURING METHOD

CROSS-REFERENCE TO RELATED APPLICATIONS

This application is the U.S. national phase entry of International Patent Application No. PCT/EP2011/063443, filed Aug. 4, 2011, which claims the benefit of U.S. provisional application 61/380,959, which was filed on Sep. 8, 2010, both of which are incorporated herein in their entireties by reference.

FIELD

The present invention relates to a lithographic apparatus, an EUV radiation generation apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \tag{1}$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm such as 13.5 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

The laser beam which is directed at the fuel may be generated by a laser apparatus which is configured to provide the laser beam with a power of several tens of kilowatts. In order to provide the laser beam with this high power the laser apparatus may include a gain medium which operates at a very high gain. The very high gain of the gain medium may create challenges. For example, laser radiation which is reflected by the fuel (or the plasma) may travel through the gain medium and may be amplified to a sufficiently high power that it may damage optical components of the laser apparatus. In addition, when this radiation travels through the gain medium it may cause depletion of the gain of the gain medium. Furthermore, the laser apparatus may suffer from unwanted self-lasing. Unwanted self-lasing is the spontaneous generation of a laser beam by the laser apparatus when the laser beam is not desired.

SUMMARY

It is desirable to provide a lithographic apparatus, and EUV radiation generation apparatus and a device manufacturing method which overcomes or mitigates at least one of the above challenges or some other challenge associated with prior art lithographic apparatus.

According to an aspect of the invention, there is provided an EUV radiation generation apparatus that includes a laser configured to generate pulses of laser radiation and an optical isolation apparatus that includes a rotatably mounted reflector and a radially positioned reflector. The rotatably mounted reflector and the laser are synchronized such that a reflective surface of the rotatably mounted reflector is in optical communication with the radially positioned reflector when the optical isolation apparatus receives a pulse of laser radiation to allow the pulse of laser radiation to pass to a plasma formation location and cause a radiation emitting plasma to be generated via vaporization of a droplet of fuel material. The rotatably mounted reflector and the laser are further synchronized such that the reflective surface of the rotatably mounted reflector is at least partially optically isolated from the radially positioned reflector when the optical isolation apparatus receives radiation reflected from the plasma formation location.

According to an aspect of the invention, there is provided a lithographic apparatus including an EUV radiation generation apparatus according to the present invention, an illumination system configured to condition a radiation beam generated by the EUV radiation generation apparatus, a support constructed to support a patterning device, the patterning device being configured to impart the radiation beam with a pattern in its cross-section to form a patterned radiation beam, a substrate table constructed to hold a substrate, and a projection system configured to project the patterned radiation beam onto a target portion of the substrate.

The one or more radially positioned reflectors may be configured to displace the pulses of laser radiation in a direction parallel to the optical axis. Additionally or alternatively, the one or more radially positioned reflectors have an optical power. The one or more reflective surfaces of the rotatably mounted reflector may have an optical power. Rotation of the rotatably mounted reflector may be controlled by a controller configured to rotate the rotatably mounted reflector such that the repetition rate of the laser is equal to or a multiple of the rotation frequency of the rotatably mounted reflector.

According to an aspect of the invention, there is provided a device manufacturing method that includes generating a pulse of laser radiation with a laser, passing the pulse of laser radiation via an optical isolation apparatus that includes a rotatably mounted reflector oriented such that it is in optical communication with a radially positioned reflector, and directing the pulse of laser radiation to a plasma formation location to vaporize a droplet of fuel material and generate a radiation emitting plasma. The method also includes orienting the rotatably mounted reflector to be at least partially optically isolated from the radially positioned reflector when radiation reflected from the plasma formation location is received at the optical isolation apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
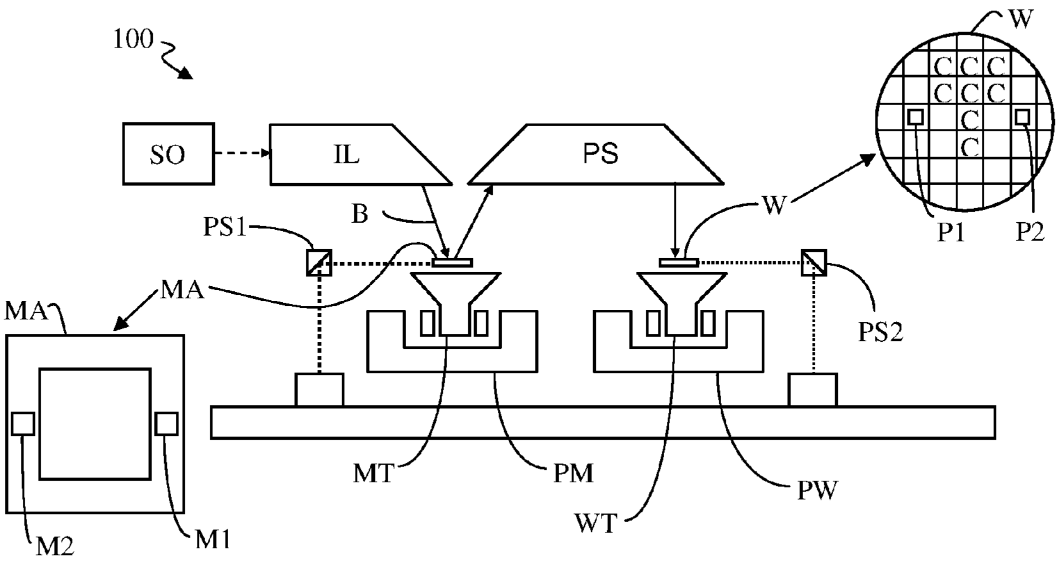
FIG. 1 depicts a lithographic apparatus according to an embodiment of the invention.

FIG. 1 schematically depicts a lithographic apparatus 100 according to an embodiment of the invention. The apparatus comprises: a source collector module (SO) configured to generate a radiation beam B (e.g. EUV radiation); an illumination system (illuminator) IL configured to condition the radiation beam B; a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term “patterning device” should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus may be of a reflective type (e.g. employing a reflective mask).

The lithographic apparatus may be of a type having two (dual stage) or more substrate tables (and/or two or more mask tables). In such “multiple stage” machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma (“LPP”) the desired plasma can be produced by irradiating a fuel with a laser beam. Fuel may for example be a droplet, stream or cluster of material having the desired line-emitting element. The resulting plasma emits output radiation, e.g. EUV radiation, which is collected using a radiation collector located in the source collector module. The laser apparatus used to generate the laser beam and the source collector module may be separate entities, for example when a $CO_2$ laser is used to provide the laser beam. The laser apparatus and the source collector module SO may be considered together to comprise an EUV radiation generation apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
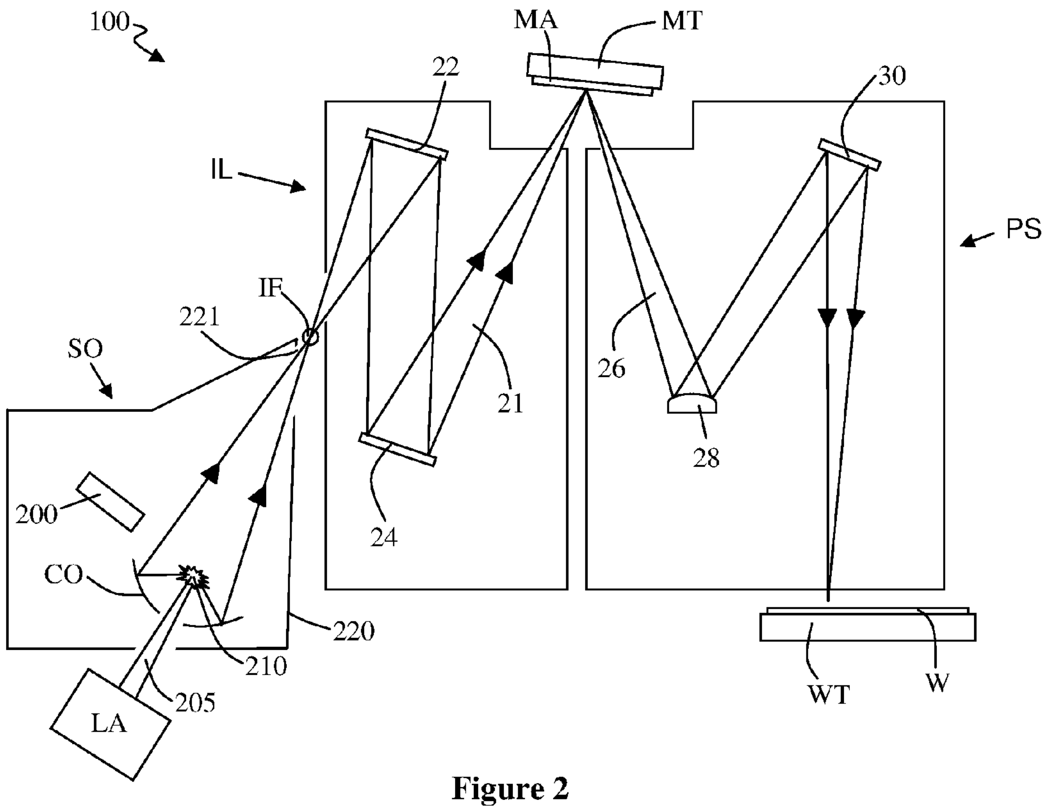
FIG. 2 depicts the lithographic apparatus of FIG. 1 in more detail.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO.

A laser apparatus LA is arranged to deposit laser energy via a laser beam 205 into a fuel, such as xenon (Xe), tin (Sn) or lithium (Li) which is provided from a fuel supply 200, thereby creating a highly ionized plasma 210 with electron temperatures of several 10's of eV. The energetic radiation generated during de-excitation and recombination of these ions is emitted from the plasma, collected and focussed by a near normal incidence collector CO.

Radiation that is reflected by the collector CO is focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS.

Figure 3A:
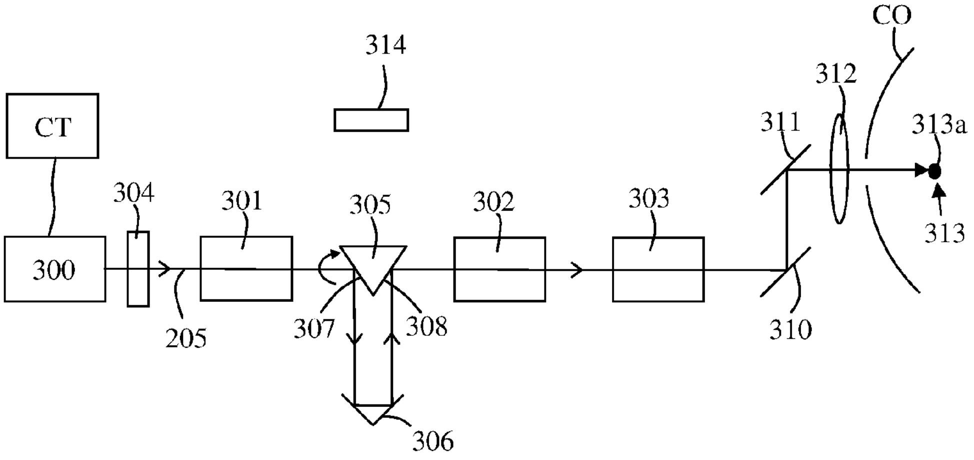
FIGS. 3*a* and 3*b* depict an EUV radiation generation apparatus according to an embodiment of the invention.

FIG. 3*a* shows schematically an EUV radiation generation apparatus according to an embodiment of the invention. The apparatus comprises a laser (referred to here as the master oscillator 300) and first, second and third power amplifiers 301-303. A polarizer 304 is located between the master oscillator 300 and the first power amplifier 301. A rotatably mounted reflector 305 is located between the first power amplifier 301 and the second power amplifier 302. The rotatably mounted reflector 305 is driven by a motor (not shown) to rotate about the optical axis of the apparatus or an axis which is substantially parallel to the optical axis of the apparatus. A radially positioned reflector 306 with two reflecting surfaces faces the rotatably mounted reflector 305. The radially positioned reflector 306 is separated radially from the rotatably mounted reflector 305 relative to the optical axis OA.

The radially positioned reflector 306 is oriented such that when a first reflecting surface 307 of the rotatably mounted reflector 305 directs a laser pulse 205 to the radially positioned reflector 306, the radially positioned reflector 306 reflects the laser beam to a second reflecting surface 308 of the rotatably mounted reflector. This allows the laser pulse 205 to travel from the first power amplifier 301 to the second power amplifier 302 and onwards.

The apparatus further comprises two beam steering mirrors 310, 311 and focusing optics 312. Although two beam steering mirrors 301, 311 are shown, any number of beam steering mirrors may be used. The beam steering mirrors 310, 311 and focusing optics 312 receive the laser beam 205 once it has been amplified by the three power amplifiers 301-303, and are together configured to direct and focus the laser beam 205 at a plasma formation location 313. A droplet of fuel material 313*a* is delivered to the plasma formation location 313 by a fuel supply (not shown). The laser pulse 205 causes the fuel material droplet 313*a* to vaporize, thereby forming an EUV radiation generating plasma. The collector CO collects radiation generated by the plasma and focus it at the intermediate focus of the lithographic apparatus (see FIG. 2).

The components shown in FIG. 3*a*, with the exception of the collector CO and the droplet of fuel material 313*a*, may be considered to comprise the laser apparatus LA shown in FIG. 2.

The rotatably mounted reflector 305 of the EUV generation apparatus allows the first power amplifier 301 to be isolated from the second and third power amplifiers 302, 303. The manner in which this isolation is achieved is shown in FIG. 3*b*.

Figure 3B:
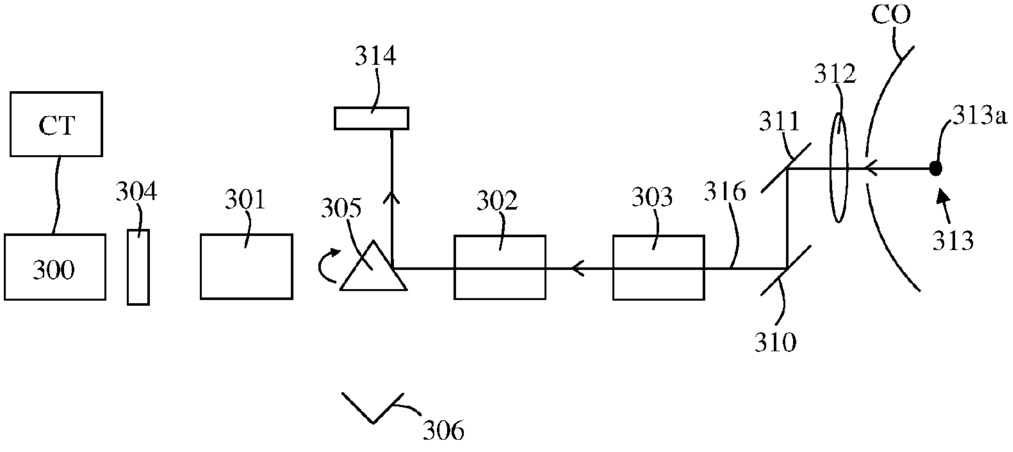

FIG. 3*b* shows the same EUV generation apparatus as FIG. 3*a*, but with the rotatably mounted reflector 305 rotated through 180°. As a consequence of this rotation the first and second reflecting surfaces 307, 308 no longer face towards the radially positioned reflector 306 but instead face towards a beam dump 314.

The master oscillator 300 is no longer generating the laser pulse. Thus no laser pulse is shown travelling from the master oscillator. The droplet of fuel material 313*a* has received the laser pulse and is being heated by it (this will generate the EUV radiation emitting plasma). Part of the laser pulse is reflected by the droplet of fuel and then propagates in a reverse direction through the EUV radiation generation apparatus. Radiation which propagates reversely through the EUV radiation generation apparatus is referred to herein as reversely propagating radiation 316. The reversely propagating radiation 316 passes through an opening in the collector CO and then passes via the focusing optics 312 and beam steering mirrors 310, 311 to the third power amplifier 303. The reversely propagating radiation 316 may be amplified by the third power amplifier 303. It may then pass into the second power amplifier 302 where it is further amplified. However, instead of passing via the radially positioned reflector 306 to the first power amplifier 301, the reversely propagating radiation 316 is reflected by the second reflecting surface 308 of the rotatably mounted reflector 305 towards the beam dump 314. The beam dump 314 absorbs the reversely propagating radiation 316 and the reversely propagating radiation therefore does not travel any further within the EUV generation apparatus. The rotatably mounted reflector 305 and the radially positioned reflector 306 together comprise an optical isolation apparatus.

Although the reversely propagating radiation 316 shown in FIG. 3*b* arises from reflection of the laser pulse from the fuel droplet, reversely propagating radiation may also arise from reflection of the laser pulse from the plasma which is formed by the fuel droplet. Reflection of the laser pulse from the fuel droplet or from the plasma may collectively be referred to as reflection of the radiation from the plasma formation location. In addition, some reversely propagating radiation may also arise from radiation generated by the plasma.

The optical isolation apparatus protects the first power amplifier 301, polarizer 304 and master oscillator 300 by preventing the reversely propagating radiation 316 from reaching them. The optical isolation apparatus also reduces the likelihood that self-lasing will occur. This is because the first power amplifier 301 is isolated from the second and third power amplifiers 302, 303, thereby reducing the cumulative gain which is provided by the power amplifiers 301-303 (and also because the reversely propagating radiation is isolated from mirror(s) of the master oscillator which therefore cannot form part of a laser cavity).

Although the rotatably mounted reflector 305 is shown in only two orientations in FIGS. 3*a* and 3*b*, it will be appreciated that the rotatably mounted reflector passes through a 360° rotation. Additional beam dumps (not shown) are provided such that reflecting surfaces 307, 308 of the rotatably mounted reflector 305 face towards a beam dump for the majority of orientations of the rotatably mounted reflector 305. The apparatus may be configured such that the reflecting surfaces 307, 308 either face towards a radially positioned reflector or a beam dump.

In an embodiment, only one radially positioned reflector 306 is provided and the rotatably mounted reflector 305 faces towards a beam dump in all orientations except for the orientation shown in FIG. 3*a* (to within a tolerance arising from the size of the radially positioned reflector 306 and the diameter of the laser beam 205). In an embodiment, more than one radially positioned reflector is provided.

The master oscillator 300 is driven by a controller CT to generate the laser beam 205 as a series of pulses at a predetermined repetition rate. The repetition rate may for example be in the range of 40-200 kHz, and may for example be 50 kHz. The rotation of the rotatably mounted reflector 305 may be synchronized with the master oscillator 300 by the controller CT such that it is in the orientation shown in FIG. 3*a* when the master oscillator generates a pulse of laser radiation (for an embodiment in which only one radially positioned reflector 306 is provided). The controller CT may also synchronize the generation of laser pulses by the master oscillator with the delivery of fuel droplets 313*a* to the plasma formation location 313. Thus, when a laser pulse has been generated by the master oscillator 300, the laser pulse travels via the rotatably mounted reflector 305 and radially positioned reflector 306 and is focussed by the focussing optics 312 onto a droplet of fuel material 313*a*. The pulse of laser radiation is amplified by the power amplifiers 301-303 to provide a power which is sufficient to vaporise the droplet of fuel material 313*a* and thereby generate an EUV radiation emitting plasma.

When the master oscillator 300 is not generating a pulse of laser radiation, the synchronization of the rotably mounted reflector 305 is such that the reflecting surfaces 307, 308 do not face towards the radially positioned reflector 306 but instead face towards a beam dump. This provides isolation of the master oscillator 300, polarizer 304 and first power amplifier 301 from other parts of the EUV generation apparatus.

The rotatably mounted reflector 305 may be driven to rotate at a high frequency (e.g. 50 kHz). As a result of this high frequency, the orientation of the rotatably mounted reflector 305 may change slightly between the first reflecting surface 307 directing the laser pulse 205 to the radially positioned reflector 306 and the second reflecting surface 308 receiving the laser pulse from the radially positioned reflector. If desired, this may be compensated for via appropriate adjustment of the orientation of the first reflecting surface 307 or the second reflecting surface 308 (e.g. a suitable rotation of the orientation of the first or second reflecting surface about the optical axis OA).

Although the rotatably mounted reflector 305 is shown as being between the first power amplifier 301 and the second power amplifier 302, the rotatably mounted reflector may be located at other positions. Locating the rotatably mounted reflector 305 between the first power amplifier 301 and the second power amplifier 302 may provide an advantage that the first power amplifier 301 is isolated from the second and third power amplifiers 302, 303. This may be more advantageous than for example isolating the second power amplifier 302 from the third power amplifier 303 for the reason described below.

The first power amplifier 301 may be configured to provide a high gain, whereas the second and third power amplifiers 302, 303 may be configured to provide lower gains. This is in order to provide strong amplification of the laser pulse generated by the master oscillator 300. The power of the laser pulse received by the first power amplifier 301 will be relatively low, and the high gain provided by the first power amplifier will increase the power of the laser pulse substantially. The power of the laser pulse is thus substantial when it is incident at the second power amplifier 302. For this reason it is not practical to provide the same gain using the second power amplifier 302 as was provided by the first power amplifier 301. The second power amplifier thus operates at a lower gain than the first power amplifier 301 (although it provides a higher power output radiation pulse than the first power amplifier). The radiation pulse received by the third power amplifier 303 already has a high power. Therefore, it is not practical to provide the same gain using the third power amplifier 303 as was provided by the first power amplifier 301. The third power amplifier 303 thus operates at a lower gain than the first power amplifier 301 (although it provides a higher power output radiation pulse than the first power amplifier and the second power amplifier). Thus, the first power amplifier 301 provides significantly higher gain than the second and third power amplifiers 302, 303. The combined operation of the first, second and third power amplifiers 301-303 may be sufficient for example to amplify the power of the laser pulse 205 to the order of tens of kilowatts.

When considering the potentially damaging effect of reversely propagating radiation 316 in the EUV generation apparatus, the gains of the power amplifiers 301-303 may be important. If the rotatably mounted reflector 305 were not present then reversely propagating radiation travelling through the EUV generation apparatus would be amplified by each of the power amplifiers 301-303. The second and third power amplifiers 302, 303 would significantly increase the power of the radiation. The first power amplifier 301 would then provide a large increase of the power of the radiation. The power of the reversely propagating radiation following amplification by the second and third power amplifiers 302, 303 may be sufficiently low so that it is not liable to damage optical components of the EUV generation apparatus. However, the power of the reversely propagating radiation after amplification by the first power amplifier 301 may be sufficiently high that it may damage the polarizer 304 or the master oscillator 300. Providing the rotatably mounted reflector 305 between the first and second power amplifiers 301, 302 prevents this from happening (or substantially reduces the likelihood that it happens).

The rotatably mounted reflector 305 could be located between the polarizer 304 and the first power amplifier 301. However, a potential disadvantage of providing the rotatably mounted reflector at this location would be that the gain of the first power amplifier 301 may be depleted by reversely propagating radiation. Although some depletion of the gain of the second and third power amplifiers 302, 303 may be caused by reversely propagating radiation, this will be a relatively small effect due to the relatively low intensity of the reversely propagating radiation in those power amplifiers. In contrast, the high gain of the first power amplifier 301 means that the reversely propagating radiation may cause significant depletion of the gain of the first power amplifier. Furthermore, the elapsed time between passage of the laser pulse 205 and arrival of the reversely propagating radiation will be greatest for the first power amplifier 301, allowing more time for the recovery of stored energy in the first amplifier (and allowing more gain to be depleted from the first power amplifier). Depletion of the gain of the first power amplifier 301 is undesirable since the gain may not recover sufficiently quickly to provide a desired amplification to the next laser pulse generated by the master oscillator 300. If this were to happen then the intensity of radiation delivered to a droplet of fuel material 313*a* would be reduced, thereby reducing the effectiveness with which the droplet of fuel material would be vaporised. This problem is less significant for the second and third power amplifiers 302, 303 since their gains are significantly lower and may recover more quickly.

The rotatably mounted reflector 305 could be located between the master oscillator 300 and the polarizer 304. However, a potential disadvantage of providing the rotatably mounted reflector 305 at this location is that the reversely propagating radiation may cause damage of the polarizer 304 (in addition to depleting the gain of the first power amplifier 301). The polarizer 304 may be configured such that it is transmissive for radiation having a polarization which corresponds with the polarization of radiation generated by the master oscillator 205. The reversely propagating radiation will include a substantial component having a transverse polarization, and this component of the reversely propagating radiation will be blocked by the polarizer 304. A proportion of this blocked component may be absorbed by the polarizer 304 and may damage the polarizer.

The rotatably mounted reflector 305 could be located between the second power amplifier 302 and the third power amplifier 303. This may provide the advantage of isolating the first and second power amplifiers 301, 302. However, it may make it more difficult for the rotatably mounted reflector 305 to provide effective optical isolation. This is because the rotatably mounted reflector 305 may be required to move from an orientation which optically connects the master oscillator 300 to the power amplifiers 301-303, to an orientation which isolates the master oscillator, sufficiently quickly that radiation emitted by the EUV radiation emitting plasma 315 does not travel to the master oscillator. The available time for this to take place depends upon the optical path length between the rotatably mounted reflector 305 and the plasma generation location 313. If the rotatably mounted reflector 305 is located between the first and second power amplifiers 301, 302 then this provides a longer optical path length than would be case if the rotatably mounted reflector were to be located between the second and third power amplifiers 302, 303.

Figure 4:
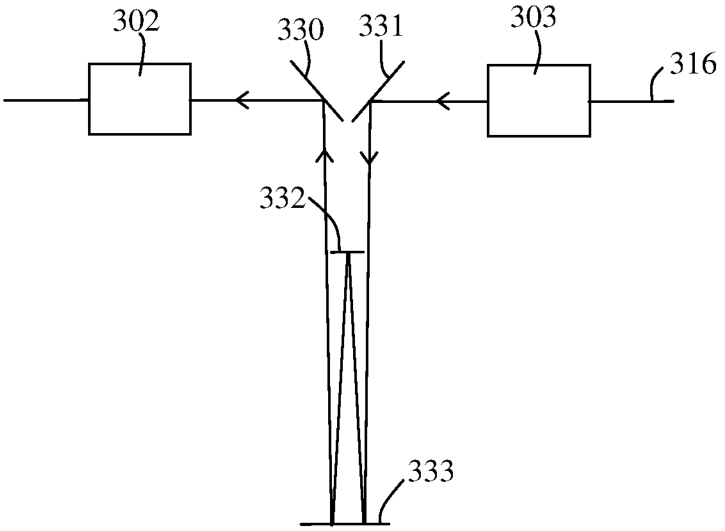
FIG. 4 depicts a delay line apparatus according to an embodiment of the invention.

The EUV generation apparatus may be provided with an optical delay line to increase the optical path length between the plasma formation location 313 and the rotatably mounted reflector 305. An example of a suitable optical delay line is shown schematically in FIG. 4. The optical delay line comprises first and second beam steering mirrors 330, 331 which are configured to direct radiation into and out of the delay line, and further comprises a pair of mirrors 332, 333 which face each other (referred to here as first and second delay mirrors). A ray of reversely propagating radiation 316 is shown in FIG. 4 to illustrate the path that radiation takes in the delay line. On leaving the third power amplifier 303, the reversely propagating radiation 316 is reflected by a first beam steering mirror 331 towards a first delay mirror 333. The reversely propagating radiation is reflected by the first delay mirror 333 towards the second delay mirror 332 and is then returned to the first delay mirror. The first delay mirror then directs the reversely propagating radiation towards a second beam steering mirror 330 which directs the reversely propagating radiation into the second power amplifier 302.

The delay provided by the delay line depends upon the distance from the beam steering mirrors 330, 331 to the first delay mirror 333, and the distance from the first delay mirror to the second delay mirror 332. The delay line may have a length which is sufficient to allow the rotatably mounted reflector 305 to move to an orientation which optically isolates the first amplifier 301 (or other optical component) after a laser pulse 205 has been transmitted by the rotatably mounted reflector and before reversely propagating radiation 316 arrives at the rotatably mounted reflector. Calculation of an appropriate length for the delay line may take into account the duration of the laser pulse 205 and the time desired for the optical isolation apparatus to move to an optically isolating configuration. The calculation may also include reflection properties of the fuel droplet. The length of the delay line may for example be sufficient to allow the entire laser pulse 205 (or the majority of the laser pulse) to travel to the plasma formation location 313 while allowing reversely propagating radiation to be isolated by the optical isolation apparatus. Similarly, the length of the delay line may for example be sufficient to allow the entire laser pulse 205 (or the majority of the laser pulse) to be amplified by a power amplifier before reversely propagating radiation arrives at that power amplifier.

The duration of the laser pulse may be selected to provide good vaporization of the fuel droplet. The laser pulse may for example be between 100 ns and 2 s in duration, or may have some other duration.

The delay line may for example have an optical path length which is 3 meters or longer, 10 meters or longer or 50 meters or longer. The delay line may for example have an optical path length up to 200 meters long. A longer delay may be achieved by configuring the first and second delay mirrors 333, 332 such that multiple reflections occur between them. For example, if the distance between the first and second delay mirrors 333, 332 is 8 meters then 25 reflections between them will provide an optical path length of 200 meters. The first and second delay mirrors 333, 332 may have high reflectivity (for example R=99.9%) so that multiple reflections do not cause a significant reduction of the power of the laser pulse 205 when it passes through the delay line.

The radially positioned reflector 306 shown in FIGS. 3*a* and 3*b* has two reflecting surfaces. However, the radially positioned reflector may have a different number of reflecting surfaces (the radially positioned reflector may for example be a corner cube). The radially positioned reflector 306 may provide displacement along the optical axis OA such that the laser beam 205 is displaced before it is directed back towards the rotatably mounted reflector 305 (e.g. as shown in FIG. 3*a*). Such an arrangement may be suitable for example when a reflecting surface of the rotatably mounted reflector 305 is oriented such that the laser beam is reflected transverse to the optical axis of the apparatus. In an embodiment (not illustrated), a reflecting surface of the rotatably mounted reflector may be oriented such that the laser beam is not reflected transverse to the optical axis but instead is reflected within an orientation which includes a component in the direction of the optical axis. Where this is the case, it may not be desirable to provide displacement along the optical axis OA when reflecting the laser beam back towards the rotatably mounted reflector. The radially positioned reflector 306 of FIG. 3*a* could be replaced by a flat mirror or some other suitable reflector. The separation of the radially positioned reflector 306 from the rotatably mounted reflector may include a component in a non-radial direction.

Figure 5:
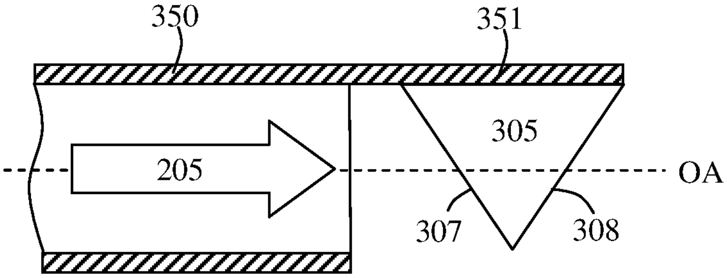
FIG. 5 depicts an embodiment of a rotatably mounted reflector which forms part of the EUV radiation generation apparatus shown in FIGS. 3*a* and 3*b;*

The rotatably mounted reflector 305 may be mounted on a hollow axle through which laser pulses 205 travel, as shown schematically in FIG. 5. FIG. 5 shows the rotatably mounted reflector 305 and part of the hollow axle 350. The hollow axle 350 is coaxial with the optical axis OA of the EUV generation apparatus and is driven to rotate about the optical axis OA by a motor (not shown). The motor may for example be provided adjacent to the hollow axle 350, and may for example be provided around the circumference of the hollow axle. The hollow axle 350 is generally cylindrical, but includes a portion 351 which extends at one end and which is not generally cylindrical. The rotatably mounted reflector 305 is connected to this extending portion rather than being located within the hollow axle 350. This allows a laser pulse 205 to be reflected from the first reflecting surface 307 of the rotatably mounted reflector without it hitting an inner surface of the hollow axle 350. Similarly, radiation may travel to the second reflecting surface 308 of the rotatably mounted reflector 305 without hitting an outer surface of the hollow axle 350. In an embodiment (not illustrated), the rotatably mounted reflector 305 is located within the hollow axle 350, and an opening is provided in the hollow axle which allows radiation to be reflected from, and incident upon, the rotatably mounted reflector.

It is not necessary that the rotatably mounted reflector 305 be mounted on a hollow axle 350. In an embodiment (not illustrated), the first and second reflecting surfaces 307, 308 may be separated from one another in a direction parallel to the optical axis. This separation may provide space within which a rotatable mounting may be provided.

Figure 6:
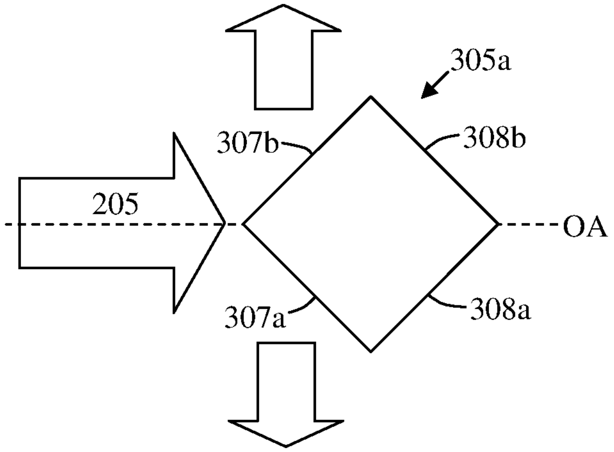
FIG. 6 depicts a rotatably mounted reflector according to an embodiment of the invention.
Figure 7:
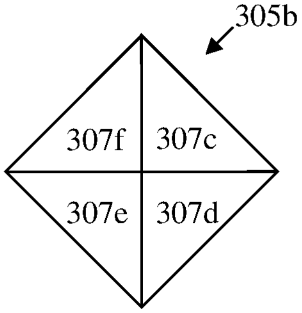
FIG. 7 depicts a rotatably mounted reflector according to an embodiment of the invention.

Although the rotatably mounted reflector 305 described above has two reflecting surfaces 307, 308 the rotatably mounted reflector may be provided with other numbers of reflecting surfaces. FIGS. 6 and 7 show schematically two possible configurations of rotatably mounted reflector.

FIG. 6 shows an embodiment of a rotatably mounted reflector 305*a* viewed from one side. The rotatably mounted reflector 305*a* comprises first and second reflecting surfaces 307*a*, 307*b* which meet at the optical axis OA of the apparatus. Third and fourth reflecting surfaces 308*a*, 308*b* are provided on an opposite side of the rotatably mounted reflector 305*a* and also meet at the optical axis OA of the apparatus. A laser beam 205 is shown schematically as being incident upon the rotatably mounted reflector 305*a*. Half of the laser beam is reflected as a sub-beam by the first reflecting surface 307*a* in a first direction and half of the laser beam is reflected as a sub-beam by the second reflecting surface 307*b* in a second direction. Radially positioned reflectors (not shown) are provided to receive the radiation and reflect it back to the third and fourth reflecting surfaces 308*a,b* of the rotatably mounted reflector 305*a*.

An embodiment of a rotatably mounted reflector 305*b* is shown in FIG. 7. The rotatably mounted reflector 305*b* is not shown viewed from one side but is instead shown viewed along the optical axis of the apparatus. It can be seen that the rotatably mounted reflector 305*b* is provided on one side with four reflecting surfaces 307*c-f*. These reflecting surfaces meet at the optical axis of the apparatus. The laser beam (not shown) is split into four sub-beams by the rotatably mounted reflector 305*b*. Each sub-beam will be incident at a different radially positioned reflector and will be returned to corresponding reflecting surfaces (not visible) provided on an opposite side of the rotatably mounted reflector 305*b*.

In the embodiment shown in FIG. 7, the rotatably mounted reflector 305*b* rotates about an axis which corresponds with the optical axis OA. In an embodiment, the axis of rotation of the rotatably mounted reflector 305*b* may be displaced relative to the optical axis OA. This displacement may be such that the laser beam 205 is not incident upon all four reflective surfaces 307*c-f* of the rotatably mounted reflector at a given time, but instead is incident upon one of these reflective surfaces (or two when the laser beam 205 overlaps a side edge between adjacent reflective surfaces). Where this is done, the position(s) of the radially positioned reflector(s) and beam dump(s) may be modified accordingly.

Figure 8:
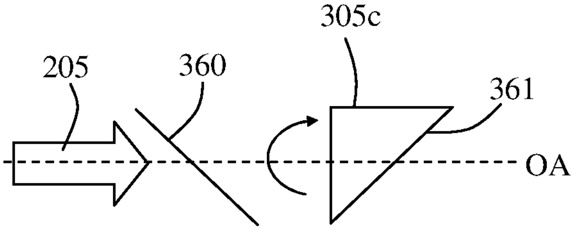
FIG. 8 depicts a rotatably mounted reflector according to an embodiment of the invention.

An embodiment of a rotatably mounted reflector 305*c* is shown viewed from one side in FIG. 8. The rotatably mounted reflector 305*c* is provided with a reflecting surface 361 which is oriented to receive reversely propagating radiation travelling through the EUV radiation generation apparatus. However, the rotatably mounted reflector 305*c* is not provided with a reflecting surface which is oriented to receive the laser beam 205. Instead, a fixed reflector 360 is located in front of the rotatably mounted reflector 305*c* and is oriented to receive the laser beam 205. A motor (not shown) configured to rotate the rotatably mounted reflector 305*c* may be provided between the rotatably mounted reflector and the fixed reflector 360.

The rotatably mounted reflector 305*c* shown in FIG. 8 may provide optical isolation of optical components of the EUV radiation generation apparatus from reversely propagating radiation in the same manner as rotatably mounted reflectors 305, 305*a,b* described further above in relation to FIG. 3. The rotatably mounted reflector 305*c* may be synchronized with the master oscillator 300 such that the reflecting surface 361 is oriented to receive a laser pulse 205 reflected from a radially positioned reflector and is oriented such that reversely propagating radiation is directed towards a beam stop when it is received.

The rotatably mounted reflector 305, 305*a-c* may be provided with any suitable number of reflecting surfaces which are oriented to receive reversely propagating radiation. This number may be for example, 1, 2, 3, 4, 5, 6, 7, 8 or more. A corresponding number of reflecting surfaces may be provided on an opposite side of the rotatably mounted reflector. Alternatively, a corresponding number of fixed reflectors which are oriented to receive the laser beam 205 may be provided.

In an embodiment, the rotatably mounted reflector 305, 305*a-c* may include one or more reflecting surfaces which are provided with an optical power. In an embodiment, the one or more radially positioned reflectors 306 may include an optical power.

In an embodiment the diameter of the laser beam may be around 30 mm. The EUV generation apparatus may be configured as shown in FIG. 3, with the rotatably mounted reflector 305 having first and second reflecting surfaces 307, 308 which each have a 50 mm diameter (this may allow some tolerance for the laser beam to be incident upon the reflecting surfaces). The master oscillator 300 may operate at a repetition rate of 50 kHz, thereby providing a pulse of laser radiation every 20 microseconds. The pulse may have a duration of 2 microseconds. The rotatably mounted reflector 305 may be driven to rotate at 50 kHz, and may be synchronized with the master oscillator 300 such that each time a laser pulse is generated by the master oscillator the rotatably mounted reflector is facing the radially positioned reflector.

In this embodiment, the period of time during which the master oscillator generates no laser radiation (18 microseconds) is nine times as long as a period of time during which it generates the laser pulse (2 microseconds). The length of the beam dump 314 in this embodiment may therefore be nine times the length of the radially positioned reflector. The radially positioned reflector may for example have a length of 100 mm and the beam dump may for example have a length of 900 mm. The combined length of the radially positioned reflector and the beam dump 314 may therefore be 1 m. In this example, the radially positioned reflector and the beam dump would be provided in a ring located around the rotatably mounted reflector 305, the ring having a circumference of 1 m and a diameter of 320 mm. The circumference may be changed by changing the length of the radially positioned reflector and making a corresponding change to the length of the beam dump.

The repetition rate of the master oscillator may for example be in the range of 20 kHz to 100 kHz, or may be greater than 100 kHz.

If it is not possible or is not desirable to rotate the rotatably mounted reflector 305 at the repetition rate of the master oscillator 300, then the rotatably mounted reflector may be rotated at a lower frequency. Where this is done, additional radially positioned reflectors may be needed, the radially positioned reflectors being distributed such that the rotatably mounted reflector 305 is facing a radially positioned reflector each time the master oscillator generates a laser pulse. In an embodiment, the repetition rate of the master oscillator is 50 kHz, and the rotation frequency of the rotatably mounted reflector 305 is 1.667 kHz (100,000 rpm). Thirty radially positioned reflectors are distributed to ensure that each laser pulse generated by the master oscillator 300 is incident upon a radially positioned reflector. The laser pulses are incident upon the radially positioned reflectors in series. Where this approach is used, the combined circumference of the radially positioned reflectors and the beam dumps will be increased. For example, if each radially positioned reflector is 50 mm long then each beam dump may be 450 mm long. Since thirty radially positioned reflectors are provided this gives rise to a total length of 15 m, which corresponds to a diameter of 4.8 m.

The approach described above whereby the rotation frequency of the rotatably mounted reflector 305 is reduced and the number of radially positioned reflectors is increased may not be appropriate for an embodiment in which a fixed reflector is oriented towards the master oscillator (e.g. as shown in FIG. 8). This is because the laser pulses will always be delivered to the same location by the fixed reflector. In an embodiment, the fixed reflector may be provided with a plurality of reflective surfaces which are configured to separate the laser pulse into a plurality of sub-beams. Where this is done, the rotatably mounted reflector may be provided with a corresponding number of reflective surfaces and a corresponding number of radially positioned reflectors may also be provided. The rotation frequency of the rotatably mounted reflector may then be reduced by a factor which is related to the number of reflective surfaces of the fixed reflector. For example, if the fixed reflector has two reflective surfaces then the rotation frequency may be reduced by a factor of two, if the fixed reflector has four reflective surfaces then the rotation frequency may be reduced by a factor of two or a factor of four, etc.

As explained further above, the rotatably mounted reflector may be provided with a plurality of reflecting surfaces which receive reversely propagating radiation. A corresponding number of rotatably mounted reflecting surfaces or static reflecting surfaces may also be provided, these reflecting surfaces being configured to receive the laser beam 205 and direct sub-beams to different radially positioned reflectors. Where this is the case, the number of radially positioned reflectors may correspond with the number of sub-beam generating reflecting surfaces (or may be a multiple of the number of sub-beam generating reflecting surfaces if the sub-beam generating surfaces are provided on a rotatably mounted reflector). The combined circumference of the radially positioned reflectors and beam dumps may change accordingly.

A general expression which may be used to determine the combined circumference of the radially positioned reflectors and beam stops is:

$$\text{Circumference} = \frac{f_f}{f_r} \cdot \frac{t_l}{t_p} \cdot d \tag{2}$$

where $f_f$ is the frequency of fuel droplet generation, $f_r$ is the frequency of rotation of the rotatably mounted mirror 305, 305*a-c*, $t_l$ is the time separation of laser pulses generated by the master oscillator 300, $t_p$ is the duration of the laser pulses and d is the diameter of the laser beam.

From the equation it may be seen that the circumference may be made smaller for example by increasing the rotation frequency $f_r$ of the rotatably mounted mirror.

The equation assumes that the length of the radially positioned reflector corresponds to the diameter of the laser beam. However, the length of the radially positioned reflector may be greater than this.

The radially positioned reflectors and beam dumps may be driven to rotate around the rotatably mounted reflector 305 with the same direction of rotation. This may allow their combined circumference to be reduced.

In the embodiments of the invention described above, the rotatably mounted reflector 305, 305*a-c* provides optical isolation which protects the first power amplifier 301, the modulated polarizer 204 and the master oscillator 300. In other embodiments other optical components may be protected by the rotatably mounted reflector.

The term 'beam dump' as used above in the description of embodiments of the invention may be interpreted as meaning any surface which does not return reversely propagating radiation 316 to the rotatably mounted reflector 305, 305*a,b*.

Although the description refers to locations where the rotatably mounted reflector may be provided, the rotatably mounted reflector may be provided at any suitable location in the EUV radiation generation apparatus. The rotatably mounted reflector may for example be located next to the master oscillator 300 or between the third power amplifier and the plasma generation location.

Although the description refers to the EUV radiation generation apparatus having three power amplifiers 301-303, the EUV radiation generation apparatus may have any suitable number of power amplifiers.

In the above description references to vaporization of the droplet of fuel material are intended to encompass incomplete vaporization of the droplet of fuel material.

In the above description the optical axis of the apparatus may be considered to be the axis of the laser radiation beam 205 which passes through the apparatus in use (as indicated for example in FIG. 3*a*). The optical axis thus is not merely oriented in one direction but instead is oriented in different directions at different locations in the EUV radiation generation apparatus.

At various points in the above the description the term laser beam has been used instead of laser pulse for ease of explanation of the invention.

The polarizer 304 shown in FIG. 3 is an example of a polarization adjustment device. Other polarization adjustment devices which may be used include a quarter-wave plate or an optical modulator.

Because the rotatably mounted reflector moves in a continuous rotation, stresses which would be applied to the reflector for example if the reflector had a reciprocating movement are avoided.

In embodiments of the invention the rotatably mounted reflector and the laser are synchronized such that the reflective surface of the rotatably mounted reflector is optically isolated from the radially positioned reflector when the optical isolation apparatus receives radiation reflected from the plasma formation location. In some instances however, the rotatably mounted reflector may not be completely optically isolated from the radially positioned reflector when some radiation reflected from the plasma formation location is received. For example, the laser pulse 205 may include a rising edge which is low in power and a central portion which is significantly higher in power. In this situation the optical isolation apparatus may be in optical communication with the radially positioned reflector when a reflected portion of the rising edge of the laser pulse is received at the optical isolation apparatus. The optical isolation apparatus may optically isolate the rotatably mounted reflector from the radially positioned reflector before the central portion of the laser pulse is received at the optical isolation apparatus. A situation such as this may be described as partial optical isolation of the rotatably mounted reflector from the radially positioned reflector. Partial optical isolation may for example provide optical isolation from the majority of the energy of a pulse of radiation reflected from the plasma formation location.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting.

Thus it will be apparent to one skilled in the art that modifications may be made to the invention as described without departing from the scope of the claims set out below.

What is claimed is:

1. An EUV radiation generation apparatus comprising:

a laser configured to generate pulses of laser radiation; and an optical isolation apparatus comprising a rotatably mounted reflector rotatable about an optical axis of the EUV radiation generation apparatus or an axis substantially parallel to the optical axis between a first orientation and a second orientation, and a radially positioned reflector separated radially from the rotatably mounted reflector relative to the optical axis, the rotatably mounted reflector and the laser being synchronized such that when the rotatably mounted reflector is in the first orientation, a reflective surface of the rotatably mounted reflector is in optical communication with the radially positioned reflector when the optical isolation apparatus receives a pulse of laser radiation to allow the pulse of laser radiation to pass to a plasma formation location and cause a radiation emitting plasma to be generated via vaporization of a droplet of fuel material, and the rotatably mounted reflector and the laser being further synchronized such that when the rotatably mounted reflector is in the second orientation, the reflective surface of the rotatably mounted reflector is at least partially optically isolated from the radially positioned reflector when the optical isolation apparatus receives radiation reflected from the plasma formation location.

2. The EUV radiation generation apparatus of claim 1, wherein the rotatably mounted reflector comprises a reflective surface oriented towards the plasma formation location, and a reflective surface oriented towards the laser.

3. The EUV radiation generation apparatus of claim 2, wherein the rotatably mounted reflector comprises one or more additional reflective surfaces oriented towards the plasma formation location, and a corresponding number of additional reflective surfaces oriented towards the laser, and wherein the radially positioned reflector is one of a plurality of radially positioned reflectors.

4. The EUV radiation generation apparatus of claim 3, wherein the number of radially positioned reflectors is equal to or a multiple of the number of reflective surfaces of the rotatably mounted reflector oriented towards the laser.

5. The EUV radiation generation apparatus of claim 1, wherein the isolation optics further comprises a fixed reflector oriented towards the laser and configured to direct laser pulses to the radially positioned reflector, and wherein the rotatably mounted reflector comprises a reflective surface oriented towards the plasma formation location.

6. The EUV radiation generation apparatus of claim 5, wherein the rotatably mounted reflector comprises one or more additional reflective surfaces oriented towards the plasma formation location, the fixed reflector comprises one or more additional reflective surfaces oriented towards the laser, and the radially positioned reflector is one of a plurality of radially positioned reflectors.

7. The EUV radiation generation apparatus of claim 6, wherein the number of radially positioned reflectors is equal to the number of reflective surfaces of the fixed reflector oriented towards the laser.

8. The EUV radiation generation apparatus of claim 1, further comprising a power amplifier configured to amplify the pulses of laser radiation generated by the laser, and wherein the optical isolation apparatus is located between the power amplifier and the plasma formation location.

9. The EUV radiation generation apparatus of claim 8, further comprising one or more additional power amplifiers configured to further amplify the pulses of laser radiation, and wherein at least one power amplifier is located between the optical isolation apparatus and the plasma formation location.

10. The EUV radiation generation apparatus of claim 1, further comprising a delay line located between the optical isolation apparatus and the plasma formation location.

11. The EUV radiation generation apparatus of claim 1, wherein the optical isolation apparatus is configured to provide optical isolation from the majority of the energy of a pulse of radiation reflected from the plasma formation location.

12. The EUV radiation generation apparatus of claim 1, wherein the optical isolation apparatus is configured to provide optical isolation from all of the energy of a pulse of radiation reflected from the plasma formation location.

13. A device manufacturing method comprising:

generating a pulse of laser radiation with a laser;

passing the pulse of laser radiation via an optical isolation apparatus comprising a rotatably mounted reflector oriented such that it is in optical communication with a radially positioned reflector;

directing the pulse of laser radiation to a plasma formation location to vaporize a droplet of fuel material and generate a radiation emitting plasma; and orienting the rotatably mounted reflector to be at least partially optically isolated from the radially positioned reflector when radiation reflected from the plasma formation location is received at the optical isolation apparatus.

14. The device manufacturing method of claim 13, wherein the optical isolation apparatus provides optical isolation from the majority of the energy of a pulse of radiation reflected from the plasma formation location.

15. The device manufacturing method of claim 13, wherein the optical isolation apparatus provides optical isolation from all of the energy of a pulse of radiation reflected from the plasma formation location.

* * * * *